United States Patent
Tsuchi (10) Patent No.: US 7,339,422 B2
(45) Date of Patent: Mar. 4, 2008

(54) AMPLIFIER CIRCUIT AND DISPLAY DEVICE

(75) Inventor: Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 144 days.

(21) Appl. No.: 11/093,099

(22) Filed: Mar. 29, 2005

(65) Prior Publication Data

US 2005/0212597 A1     Sep. 29, 2005

(30) Foreign Application Priority Data

Mar. 29, 2004  (JP) .............................. 2004-096525

(51) Int. Cl.
    *H03F 1/02*      (2006.01)
(52) U.S. Cl. .......................................... 330/9; 330/253
(58) Field of Classification Search .................... 330/9, 330/253
    See application file for complete search history.

(56) References Cited

U.S. PATENT DOCUMENTS

| | | | | |
|---|---|---|---|---|
| 4,001,603 A | * | 1/1977 | Wilcox ........................... | 327/3 |
| 4,820,998 A | * | 4/1989 | Roessler et al. ............. | 330/258 |
| 5,854,574 A | * | 12/1998 | Singer et al. ............... | 330/293 |
| 6,411,240 B1 | * | 6/2002 | Greitschus .................. | 341/155 |
| 6,426,674 B1 | * | 7/2002 | Davidescu ..................... | 330/9 |
| 6,515,518 B1 | * | 2/2003 | Minegishi .................... | 327/65 |

FOREIGN PATENT DOCUMENTS

JP     A-2001-292041     10/2001
JP     A-2003-168936     6/2003

\* cited by examiner

*Primary Examiner*—Patricia Nguyen
(74) *Attorney, Agent, or Firm*—Scully, Scott, Murphy & Presser PC (57) ABSTRACT

Offset canceling amplifier circuit in which a high accuracy of output with a suppressed output offset is achieved and a variation in a slew rate is also suppressed, and a display device having the amplifier circuit. A first differential pair (M5, M6) connected between a first current source (M9) and a common load circuit (M1, M2) and a second differential pair (M3, M4) connected between a second current source (M8) between the common load circuit (M1, M2) are provided. A switch (SW1) connected between one input of the first differential pair (M5, M6) and an input terminal (1), a switch (SW2) connected between the one input of the differential pair (M5, M6) and an output terminal (2), a switch (SW3) connected between one input of the second differential pair (M3, M4) and the output terminal (2), and a capacitance element (C1) connected to the one input of the second differential pair (M3, M4) are provided. The other input of the first differential pair (M5, M6) is connected to the input terminal (1), and the other input of the second differential pair (M3, M4) is connected to a reference voltage input terminal (3). An amplifying operation by an amplifying element (M7) is performed responsive to a common output signal of the two differential pairs, and circuits (SW11, SW12) for controlling activation or deactivation of at least one of the first and second current sources are provided.

18 Claims, 9 Drawing Sheets

AMPLIFIER CIRCUIT AND DISPLAY DEVICE

FIELD OF THE INVENTION

The present invention relates to an amplifier circuit and a display device. The invention relates to the amplifier circuit equipped with an offset canceling function and the display device having the amplifier circuit.

BACKGROUND OF THE INVENTION

Recently, flat-panel displays such as a liquid-crystal display have become widely spread in the world, and many of these are said to be those of an active matrix type. The display unit of a liquid crystal device that uses an active matrix driving method is constituted from a structure including a semiconductor substrate with transparent pixel electrodes and thin film transistors (TFTs) disposed thereon, an opposing substrate with one transparent electrode formed on an entire surface thereof, and a liquid crystal sealed between these two opposing substrates. Then, by controlling the TFTs each having a switching function, a predetermined voltage is applied to each pixel electrode, the transmissivity of the liquid crystal is changed by a potential difference between each pixel electrode and the electrode on the opposing substrate, and the liquid crystal having a capacitive property holds its potential difference and its transmissivity for a predetermined period. An image is thereby displayed.

On the semiconductor substrate, data lines for sending a plurality of level voltages (gray-scale voltages) applied to the pixel electrodes and scanning lines each for sending a TFT switching control signal are wired in a lattice form. The data lines have become capacitive loads caused by the capacitance of the liquid crystal sandwiched between the electrode of the opposing substrate and the data lines and capacitances generated at intersections with the respective scanning lines.

Application of a gray-scale voltage to each pixel electrode is carried out through a data line, and supplying of the gray-scale voltage is performed to all pixels connected to the data line within one frame period (of approximately 1/60 seconds). For this reason, a data line driving circuit for driving the data line must drive the data line that is the capacitive load with high voltage accuracy and at high speed.

Then, for application to portable devices, low power consumption is further demanded for the data driving circuit, in addition to the driving of the data line with high accuracy and at high speed.

Further, it is required that the data line driving circuit perform driving of a lot of data lines with exact gray-scale voltages without offset. That is, high output voltage accuracy is required for an output amplifier circuit used in the data line driving circuit.

Figure 13:
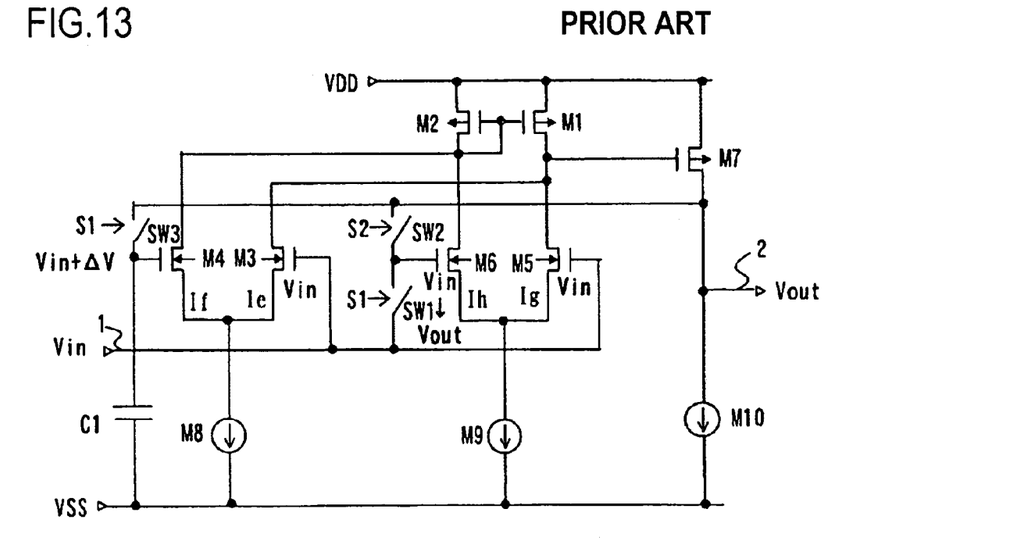
FIG. 13 is a diagram showing a configuration of a conventional circuit.
Figure 14:
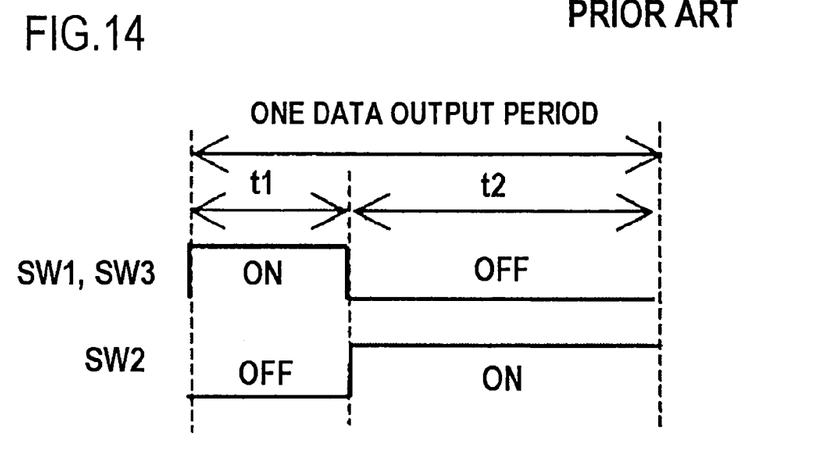
FIG. 14 is a diagram showing an example of switch control over the conventional circuit in FIG. 13.

FIGS. 13 and 14 are diagrams respectively showing an example of a configuration of a conventional amplifier circuit that aims at high accuracy and its timing operation (refer to Patent Document 1 that will be hereinafter described).

FIG. 13 is a diagram showing a configuration of an offset canceling amplifier having a function of reducing an output offset caused by a variation in transistor devices constituting an amplifier circuit. Referring to FIG. 13, this circuit has NMOS transistors M3 and M4 constituting a differential pair with the commonly connected source thereof connected to one terminal of a constant current source M8 and NMOS transistors M5 and M6 constituting a differential pair with the commonly connected source thereof connected to one terminal of a constant current source M9. The drains of the NMOS transistors M3 and M5 are connected to the drain of a PMOS transistor M1. The drains of the NMOS transistor M4 and an NMOS transistor M6 are connected to the connecting point between the drain and the gate of the PMOS transistor M2. The sources of the PMOS transistor M1 and a PMOS transistor M2 are connected to a high-potential power supply VDD, and the gates of the PMOS transistor M1 and the PMOS transistor M2 are connected in common. The PMOS transistors M1 and M2 constitute a current mirror that constitutes a common active load for the differential pairs (M3, M4) and (M5, M6). The connecting node between the NMOS transistor M5 and the PMOS transistor M1 is connected to the gate of a PMOS transistor M7 with the source thereof connected to the power supply VDD and the drain thereof connected to an output terminal 2. Between the output terminal 2 and a low-potential power supply VSS, a current source M10 is connected. The gates of the NMOS transistors M3 and M5 are connected to an input terminal 1, and the gate of the NMOS transistor M6 is connected to the input terminal 1 through a switch SW1, and connected to the output terminal 2 through a switch SW2. The gate of the NMOS transistor M4 is connected to the other terminal of a capacitance C1 with one terminal thereof connected to the low-potential power supply VSS. A switch SW3 is connected between the gate of the NMOS transistor M4 and the output terminal 2.

Referring to the timing chart in FIG. 14, in the amplifier circuit shown in FIG. 13, the switches SW1 and SW3 are turned on, and the switch SW2 is turned off during a period t1 of one data output period. To the input pair of the differential pair (M3, M4), an input voltage Vin and an output voltage Vout are input, and the input voltage Vin is input in common to the input pair of the differential pair (M5, M6). At this point, the output voltage Vout becomes a voltage (Vin+Vf) including an offset voltage (ΔV=Vf; the offset voltage output when the same voltage is applied to the input pair of a differential pair), and this voltage is stored in the capacitance element C1.

Then, the switches SW1 and SW3 are turned off, and the switch SW2 is turned on during the period t2. As a result, to the input pair of the differential pair (M3, M4), the input voltage Vin and the terminal voltage (Vin+Vf) of the capacitance element C1 are differentially input. To the input pair of the differential pair (M5, M6), the input voltage Vin and the output voltage Vout are differentially input. At this point, the voltage that is the same as that during the period t1 is input to the input pair of the differential pair (M3, M4), and the differential pair (M5, M6) also operates so as to maintain the same state in the period t1.

Accordingly, the output voltage Vout in the period t2 becomes the voltage equal to the input voltage Vin and becomes stable. That is, the circuit shown in FIG. 13 cancels an output offset and can amplify the voltage that is equal to the input voltage, for output.

Figure 15:
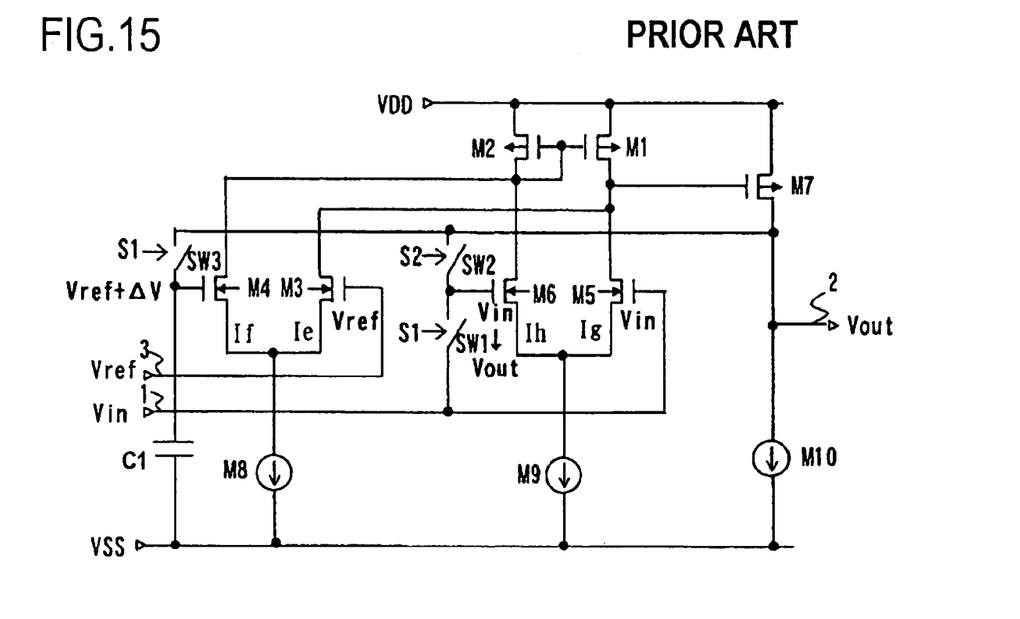
FIG. 15 is a diagram showing a configuration of a conventional circuit.

A configuration shown in FIG. 15 is a modification of the circuit shown in FIG. 13 (refer to Patent Document 2 which will be described later). The configuration shown in FIG. 15 is different from the configuration in FIG. 13 in that while in the configuration of the circuit shown in FIG. 13, the input voltage Vin is input to the gate of the transistor M2 that constitutes the differential pair, a reference voltage Vref is input to the gate of the transistor M3 that constitutes the differential pair in the example in FIG. 15. Incidentally, a timing chart for controlling respective switches in FIG. 15 is the same as that shown in FIG. 14.

In the amplifier circuit shown in FIG. 15, the switches SW1 and SW3 are turned on, and the switch SW2 is turned off during the period t1 of the one data output period. The input voltage Vin and the reference voltage Vref are input to the input pair of the differential pair (M3, M4), and the Vin is input to the input pair of the differential pair (M5, M6). At this point, the output voltage Vout becomes a voltage (Vref+ Vf) that adds the offset voltage Vf to the reference voltage Vref, and this voltage is applied to one terminal of the capacitance element C1. Then, during the period t2, the switches SW1 and SW3 are turned off, and the switch SW2 is turned on. Then, the input voltage Vref and the voltage (Vref+Vf) at the terminal of the capacitance element C1 are input to the input pair of the differential pair (M3, M4), and the Vin and the output voltage Vout are input to the input pair of the differential pair (M5, M6). At this point, the voltages which are the same as that in the period t1 are input to the input pair of the differential pair (M3, M4), and the differential pair (M5, M6) also operates to maintain the state that is the same as in the period t1. Accordingly, the output voltage Vout in the period t2 becomes equal to the input voltage Vin and becomes stable. That is, the circuit shown in FIG. 15 can cancel an output offset and can amplify the voltage that is equal to the input voltage, for output.

If the reference voltage Vref is set to an intermediate voltage in an output voltage range, the amount of the potential variation of the output voltage Vout in the period t1 can be reduced more than in the configuration in FIG. 13. For this reason, the period t1 can be reduced, and the period t2 during which highly accurate driving is performed can be extended.

[Patent Document 1]
JP Patent Kokai JP-A-2001-292041 (pp. 3-4, FIG. 1)

[Patent Document 2]
JP Patent Kokai JP-A-2003-168936 (pp. 3-4, FIG. 1)

SUMMARY OF THE DISCLOSURE

Recently, liquid-crystal display devices integral with a driving circuit, in which the driving circuit as well as a display unit is formed of thin film transistors, have been developed. However, characteristic variations of the thin film transistors that form the driving circuit are larger than those of transistors formed of monocrystal silicon. Their threshold values, for example, sometimes vary in the order of 100 mV.

On contrast therewith, the conventional offset canceling amplifiers shown in FIGS. 13 and 15 are effective if they are formed of the thin film transistors with such characteristic variations, and can suppress an output offset, thereby allowing voltage driving with high accuracy.

However, as a result of study by the inventor of the present invention, it was found that though the conventional offset canceling amplifiers of the configurations shown in FIGS. 13 and 15, formed of the transistors with large characteristic variations could achieve high voltage accuracy, a slew rate variation caused by the characteristic variations was generated. If the slew rate variations with respect to the same gray-scale voltage occur among the data lines in the driving circuit of the liquid crystal display device, a supply voltage to a pixel may also vary. For this reason this becomes a factor for degrading display quality.

Accordingly, a challenge to be addressed by the present invention is to provide an offset canceling amplifier that achieves high output accuracy by suppressing an output offset and also suppresses a slew rate variation and a display device equipped with the amplifier.

According to the present invention, the disclosure in the present application has the general configuration that will be described below.

According to a first aspect, there is provided a differential amplifier circuit. The differential amplifier circuit comprises;

a common load circuit; and a first differential pair connected between the common load circuit and a first current source and a second differential pair connected between the common load circuit and a second current source; the differential amplifier circuit performing an amplifying operation responsive to a common output signal of the first and second differential pairs; wherein the differential amplifier circuit comprises circuits for controlling activation/ deactivation of at least one of the first and second current sources.

In a differential amplifier circuit according to a second aspect of the present invention, the differential amplifier circuit comprises:

a common load circuit; and a first differential pair connected between the common load circuit and a first current source and a second differential pair connected between the common load circuit and a second current source; the differential amplifier circuit performing an amplifying operation responsive to a common output signal of the first and second differential pairs; wherein the differential amplifier circuit may include circuits for modulating and controlling current values for driving the first and second differential pairs, respectively.

In the present invention there are provided with: a first switch (SW1) connected between one input of the first differential pair (M5, M6) and an input terminal (1) of the differential amplifier circuit, a second switch (SW2) connected between the one input of the first differential pair and an output terminal (2) of the differential amplifier circuit, a third switch (SW3) connected between one input of the second differential pair (M3, M4) and the output terminal (2), and a capacitance element (C1) connected to the one input of the second differential pair. The other input of the first differential pair (M5, M6) is connected to the input terminal (1), and the other input of the second differential pair is connected to a reference voltage input terminal (3). Reference characters within brackets are strictly for reference purposes in understanding of the present invention, and should not be interpreted as limiting the present invention.

A differential amplifier circuit according to one embodiment of the present invention includes:

an input terminal;
an output terminal;
a load circuit (M1, M2) connected to a first power supply (VDD);
first and second differential pairs (M5, M6) (M3, M4) connected in common to the load circuit;
first and second current sources (M9, M8) for supplying currents to the first and second differential pairs, respectively;
an amplifying element (M7) for driving the output terminal (2) upon receipt of an output connected in common to the first and second differential pairs;
a first switch (SW1) connected between one input of the first differential pair (M5, M6) and the input terminal (1);
a second switch (SW2) connected between the one input of the differential pair and the output terminal (2);

a third switch (SW3) connected between one input of the second differential pair and the output terminal;

a capacitance element (C1) connected to the one input of the second differential pair (M3, M4);

a fourth switch (SW12) connected between the first differential pair and a second power supply (VSS), the fourth switch being connected in series with the first current source; and a fifth switch (SW11) connected between the second differential pair and the second power supply, the fifth switch being connected in series with the second current source;

the other input of the first differential pair (M5, M6) being connected to the input terminal (1);

the other input of the second differential pair (M3, M4) being connected to a reference voltage input terminal (3).

A data output period is constituted from first and second periods (t1, t2). During the first period, the first and third switches (SW1, SW3) are turned on, and the second switch (SW2) is turned off. During the second period, the first and third switches (SW1, SW3) are turned off, and the second switch (SW2) is turned on. The fourth switch (SW12) is turned on after being turned off for a predetermined period (ta) after the start of the first period (t1), and the fifth switch (SW11) is turned off for a predetermined period (tb) after the start of the second period (t2) and turned on during periods other than it. Alternatively, the other input of the second differential pair (M3, M4) may be connected to the input terminal (1), and the fourth switch (SW12) connected in series with the first current source may be provided between the first differential pair (M5, M6) and the second power supply, and the fifth switch (SW11) may be omitted.

A differential amplifier circuit according to another embodiment of the present invention comprises:

an input terminal;

an output terminal;

a load circuit (M1, M2) connected to a first power supply (VDD);

first and second differential pairs (M5, M6) (M3, M4) connected in common to the load circuit;

first and second current sources (M9, M8) for supplying currents to the first and second differential pairs, respectively;

an amplifying element (M7) for driving an output terminal (2) upon receipt of an output connected in common to the first and second differential pairs;

a first switch (SW1) connected between one input of the first differential pair (M5, M6) and the input terminal (1);

a second switch (SW2) connected between the one input of the first differential pair (M5, M6) and the output terminal (2);

a third switch (SW3) connected between one input of the second differential pair (M3, M4) and the output terminal; and a capacitance element (C1) connected to the one input of the second differential pair (M3, M4);

the other input of the first differential pair (M5, M6) being connected to the input terminal (1);

the other input of the second differential pair (M3, M4) being connected to a reference voltage input terminal (3);

a series circuit constituted from a third current source (M12) and a fourth switch (SW22) being connected between the first differential pair (M5, M6) and a second power supply (VSS) and connected in parallel with the first current source (M9);

a series circuit constituted from a fourth current source (M11) and a fifth switch (SW21) being connected between the second differential pair (M3, M4) and the second power supply (VSS), and connected in parallel with the second current source (M8).

A data output period is constituted from first and second periods (t1, t2). During the first period (t1), the first and third switches (SW1, SW3) are turned on, and the second switch (SW2) is turned off. During the second period (t2), the first and third switches (SW1, SW3) are turned off, and the second switch (SW2) is turned on. The fifth switch (SW21) is turned off after being turned on for a predetermined period (ta) after the start of the first period (t1). The fourth switch (SW22) is turned on for a predetermined period (tb) after the start of the second period (t2) and turned off during periods other than it. Alternatively, the other input of the second differential pair (M3, M4) may be connected to the input terminal (1), and only a series circuit constituted from the fourth current source (M11) and the fifth switch (SW21) and connected in parallel with the second current source (M8) may be provided between the second differential pair (M3, M4) and the second power supply. The series circuit constituted from the third current source (M12) and the fourth switch (SW22) may be omitted.

A differential amplifier circuit according to a further embodiment of the present invention includes:

first and second differential pairs (M5, M6) (M3, M4);

one load circuit (M1, M2) connected in common to the first and second differential pairs; and first and second current sources (M9, M8) for supplying currents to the first and second differential pairs, respectively. The differential amplifier circuit for performing an amplifying operation responsive to a common output signal of the first and second differential pairs may include circuits for controlling activation/deactivation of at least one of the first and second differential pairs.

EFFECTS OF THE INVENTION

According to the present invention, in the amplifier circuit formed of transistors with large characteristic variations, an effect is accomplished in which an output offset can be suppressed and a slew rate variation can also be suppressed.

OVERVIEW OF THE INVENTION

Confirmation and consideration of causes of a slew rate variation in a prior art by the inventor of the present invention as a prerequisite to the operating principle of the present invention will be described below.

Figure 10:
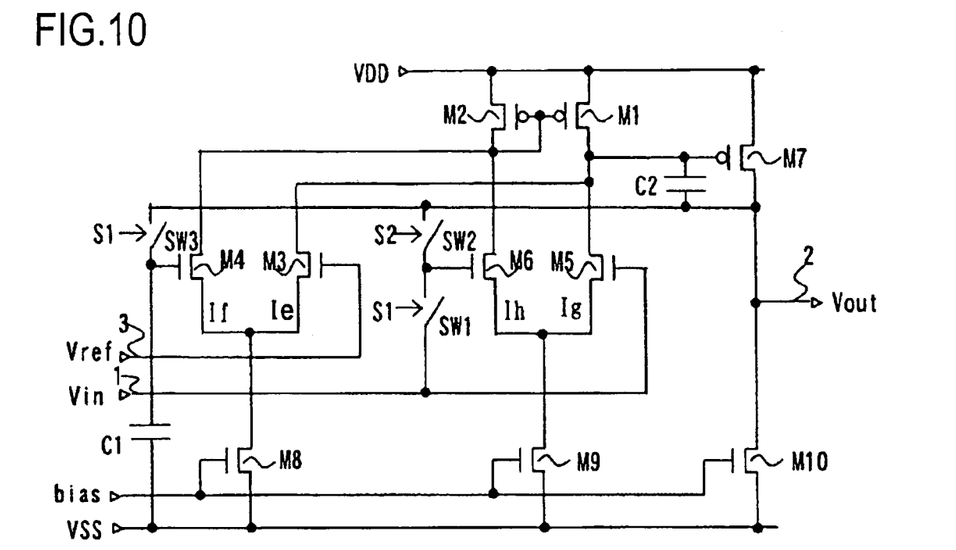
FIG. 10 is a diagram showing a circuit that simulates a conventional circuit.

FIG. 10 is a diagram showing a configuration of a circuit for simulations when an amplifier circuit of a configuration shown in FIG. 15 (an amplifier circuit fabricated by a CMOS process on a silicon substrate) is constituted from thin film transistors (TFTs).

In the configuration shown in FIG. 10, in order to stabilize an output, a phase compensating capacitance C2 is provided between an output terminal 2 and the connecting point between the output of differential pairs and the control terminal of a P-channel transistor M7. In a configuration in which the phase compensating capacitance is directly connected to the outputs of the differential pairs, for example, the slew rate variation will become manifest. Constant current sources M8, M9, and M10 are constituted from N-channel transistors with the sources thereof connected to a low-potential power supply VSS. A bias voltage bias is connected in common to the gates of the constant current sources M8, M9, and M10, and the drains of the constant current sources M8, M9, and M10 are connected to the differential pair of an M3 and an M4, the differential pair of an M5 and an M6, and the output terminal 2, respectively.

Figure 11:
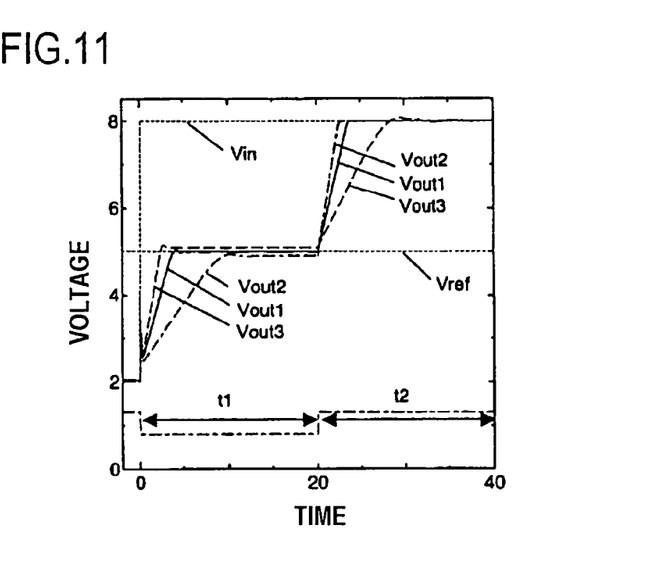
FIG. 11 is a graph showing results of simulations of the circuit in FIG. 10.

FIG. 11 shows output voltage waveforms (results of the simulations) with respect to an input voltage Vin when a reference voltage Vref is set to 5V in the circuit in FIG. 10.

Referring to FIG. 11, an output voltage waveform Vout1 is obtained when no characteristic variation in circuit devices are present. An output voltage waveform Vout2 is obtained when a threshold voltage Vth5 of the N-channel transistor M5 is larger than a threshold voltage Vth6 of the N-channel transistor M6, and an output voltage waveform Vout3 is obtained when the Vth5 is smaller than the Vth6.

Offset voltages Vf of the output voltage waveforms Vout2 and Vout3 in a period t1 are set to approximately 100 mV.

It can be seen from FIG. 11 that during the period t1 when the output terminal is driven to the reference voltage Vref, the slew rate of the Vout2 is lower than the Vout1, the offset of the Vout2 becomes negative, the slew rate of the Vout3 is higher than the Vout1, and the offset of the Vout3 becomes positive.

On the other hand, conversely, during a period t2, the slew rate of the Vout2 becomes higher than the Vout1, and the slew rate of the Vout3 becomes lower than the Vout1.

Figure 12:
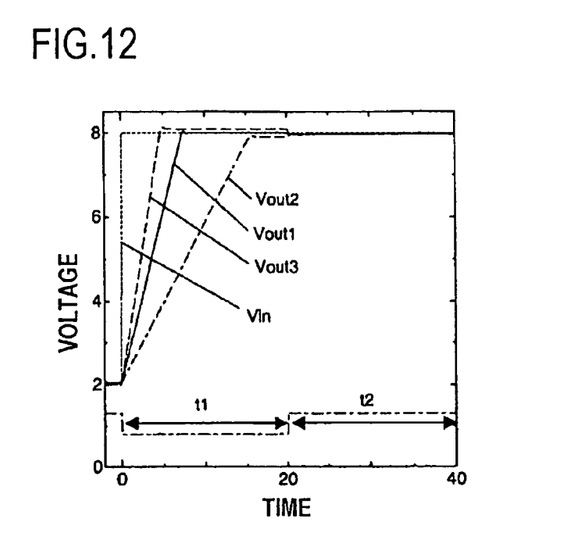
FIG. 12 is a graph showing results of simulations in the circuit in FIG. 10.

FIG. 12 shows output voltage waveforms with respect to the input voltage Vin when the reference voltage Vref is set to be equal to the Vin in the circuit for the simulations in FIG. 10. In this case, the configuration of FIG. 10 becomes the same as the configuration shown in FIG. 13.

If the relationship of the threshold voltages of the differential pair (M5, M6) is set to be the same as in the case of FIG. 11, it can be seen from FIG. 12 that during the period t1, the slew rate of the Vout2 is lower than the Vout1, the offset of the Vout2 becomes negative, the slew rate of the Vout3 is higher than the Vout1, and the offset of the Vout3 becomes positive.

As described above, when a device (characteristic) variation is large, the slew rate greatly differs depending on the condition of the device variation. In the driving circuit with multiple outputs, slew rate variations are generated among the outputs.

It was found that the slew rate variation described above was caused because intensity of an operation that changes the control terminal of the P-channel transistor M7 by the output signal of the differential pairs varies due to the characteristic variation of the thin film transistors.

This operation will be described below. Hereinafter, a current Ie, a current If, a current Ig, and a current Ih that flow through the transistors M3, M4, M5, and M6 that constitute the two differential pairs in FIG. 10 will be indicated by i3, i4, i5, and i6, respectively. The currents for the current sources M8 and M9 are indicated by constant currents I8 and I9. Further, for simplifying the description, it is assumed that no device variations except that of the differential pair (M5, M6) are present.

The differential pairs (M3, M4) and (M5, M6) are driven by the current sources M8 and M9, respectively, in the configuration in FIG. 10. Thus, in stable state of an operation, the following relations hold:

$$i3+i4=I8 \quad (1)$$

$$i5+i6=I9 \quad (2)$$

Further, an M1 and an M2 constitute a current mirror. Thus, the currents that flow through the M1 and M2 are equal, so that the following equation (3) holds:

$$i4+i6=i3+i5 \quad (3)$$

From the above equations (1) through (3), the following equations hold:

$$i3+i5=(I8+I9)/2 \quad (4)$$

$$i4+i6=(I8+I9)/2 \quad (5)$$

The sum of the i3 and the i5 and the sum of the i4 and the i6 both become constants.

When the operations of the differential pairs during the period t1 in FIG. 11 are considered, the input voltage Vin is first fed to the input pair of the differential pair (M5, M6) immediately following the start of the period t1 because the switch SW1 is in an on state and the switch SW2 is in an off state. With this arrangement, the currents i5 and i6 become constant currents according to the respective threshold voltages thereof. On the other hand, the reference voltage Vref and an output voltage Vout are fed to the input pair of the differential pair (M3, M4) because the switch SW3 is in the on state. Since the Vout has a lower potential than the Vref, the i3 will increase, and the i4 will decrease. Due to an increase in the i3, the gate potential of the transistor M7 is reduced, so that the current that flows through the transistor M7 will increase, which operates to increase the output voltage Vout. The amount of the increment of the current for the i3 at this point affects the slew rate during the period t1 in FIG. 11.

From the above equations (1) and (4), the range of a change in the current i3 in the period t1 will extend as follows:

$$I8 \geq i3 \geq \{(I8+I9)/2\}-i5 \quad (6)$$

It can be seen from the above formula (6), that the wider the range of the current i3 is, the larger the amount of the increment of the current i3 in the period t1 becomes, so that the slew rate is increased.

Here, assume that a device variation is present in the differential pair (M5, M6). Then, when the threshold voltage Vth5 of the transistor M5 is larger than the threshold voltage Vth6 of the transistor M6, the relation between the currents of i5<i6 holds during the period t1. At this point, the range of the current i3 in the above formula (6) becomes narrower, so that the slew rate is reduced.

On the other hand, when the relation between the threshold voltages Vth5 and Vth6 of the transistors M5 and M6 satisfies Vth5<Vth6, the relation between the currents of i5>i6 holds during the period t1. At this point, the range of the current i3 in the above formula (6) becomes wider, so that the slew rate is increased.

Next, when the operations of the differential pairs during the period t2 in FIG. 11 are considered, a voltage (Vref+Vf) that includes the reference voltage Vref and an offset voltage Vf with respect to the reference voltage Vref is first fed to the input pair of the differential pair (M3, M4) immediately after the start of the period t2, and the currents i3 and i4 thereby become the constant currents, respectively.

Incidentally, in regard to the relation between the currents i3 and i4 during the period t2, the relation between the currents i3 and i4 in the stable state of an operation in the period t1 is held. Accordingly, the relation of the currents i3 and i4 during the period t2 is determined by the relation between the currents i5 and i6 during the period t1 and the above equation (3). When the relation between the threshold voltages of the transistors M5 and M6 is expressed by Vth5>Vth6, i3>i4 holds. When Vth5<Vth6, i3<i4 holds.

On the other hand, the input voltage Vin and the output voltage Vout are fed to the input pair of the differential pair (M5, M6), and the Vout is in a lower potential state than the Vin. Thus, the i5 will increase, and the i6 will decrease. The gate potential of the transistor M7 is reduced due to an increase in the i5, so that the current (source-drain current) that flows through the transistor M7 will be increased, which operates to raise the output voltage Vout. The amount of the increment of the i5 at this point affects the slew rate in the period t2 during FIG. 11.

It can be seen from the above equations (2) and (4) that the range of the change in the current i5 in the period t2 will extend as follows:

$$I9 \geq i5 \geq \{(I8+I9)/2\} - i3 \qquad (7)$$

It can be seen from the above formula (7) that the wider the range of the current i5 is, the larger the amount of the increment of the current i5 in the period t2 becomes, so that the slew rate will be increased.

Here, assume that a device variation is present in the differential pair (M5, M6). When the threshold voltage Vth5 of the transistor M5 is larger than the threshold voltage of the transistor M6, the relation between the currents i3 and i4 of i3>i4 holds. Thus, the range of the change in the current i5 in the above formula (7) becomes wider, so that the slew rate is increased.

On the other hand, when the threshold voltage of the transistor M5 is smaller than the threshold voltage of the transistor M6, the relation between the currents i3 and i4 of i3<i4 holds. Thus, the range of the change in the current i5 in the above formula (7) in this case becomes narrower. Accordingly, the slew rate is reduced.

When a comparatively large device variation is present in the differential pair (M5, M6), slew rate variations as shown in FIGS. 11 and 12 are generated due to the operations described above. Likewise, when the device variation is generated in the differential pair (M3, M4) as well, the slew rate variation is of course generated.

A differential amplifier circuit according to the present invention devised based on the above-mentioned knowledge of the inventor of the present invention includes a first differential pair (M5, M6) connected between a first current source (M9) and a common load circuit (M1, M2) and a second differential pair (M3, M4) connected between a second current source (M8) and the common load circuit (M1, M2). A first switch (SW1) connected between one input of the first differential pair (M5, M6) and an input terminal (1) of the differential amplifier circuit, a second switch (SW2) connected between the one input of the first differential pair (M5, M6) and an output terminal (2) of the differential amplifier circuit, a third switch (SW3) connected between one input of the second differential pair (M3, M4) and the output terminal (2), and a capacitance element (C1) connected to the one input of the second differential pair (M3, M4) are provided. The other input of the first differential pair (M5, M6) is connected to the input terminal (1), and the other input of the second differential pair (M3, M4) is connected to the input terminal (1) or a reference voltage input terminal (3). An amplifying operation by an amplifier circuit (M7) is performed responsive to a common output signal of the two differential pairs, and circuits (SW11, SW12) for controlling activation or deactivation of at least one of the first and second current sources are provided.

A differential amplifier circuit according to other embodiment mode of the present invention may include a circuit for modulating and controlling current values of current sources for driving the first and second differential pairs, respectively.

According to the embodiment modes of the present invention, in an amplifier circuit formed of transistors with large characteristic variations, an output offset can be suppressed, and a slew rate variation can also be suppressed.

PREFERRED EMBODIMENTS OF THE INVENTION

The preferred mode for carrying out the present invention will be described below in detail with reference to the drawings.

Figure 1:
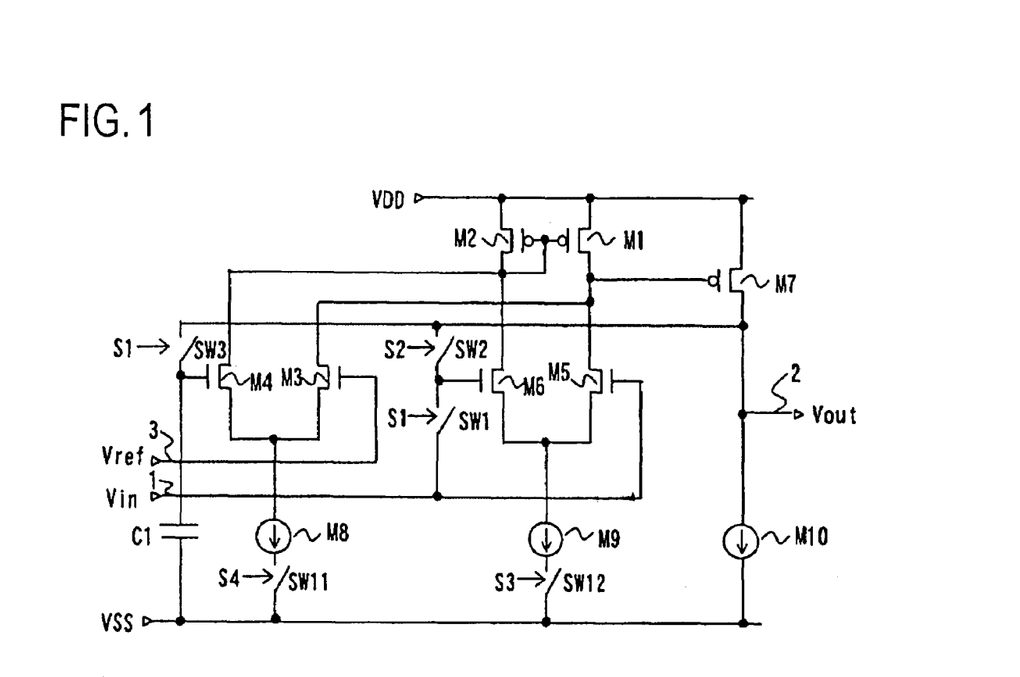
FIG. 1 is a diagram showing a configuration of an embodiment mode of the present invention.

FIG. 1 is a diagram showing a configuration of the preferred mode for carrying out the present invention. Referring to FIG. 1, a differential amplifier circuit according to an embodiment mode of the present invention is obtained by adding circuits for controlling activation and deactivation of two current sources M8 and M9, respectively, to an offset canceling amplifier shown in FIG. 15. As the circuits for controlling the activation and the deactivation of the two current sources M8 and M9, respectively, a switch SW11 connected in series with the current source M8 and a switch SW12 connected in series with the current source M9 are provided. Incidentally, the differential amplifier circuit in FIG. 1 is constituted from TFTs. In each of the drawings appended to the specification of the present application including FIG. 1, a configuration of a capacitance element C1 is shown of which one terminal thereof is connected to one input of a second differential pair (M3, M4) and the other terminal thereof is connected to a low-potential power supply VSS. Connection to the other terminal of the capacitance element C1 may also be performed using a high-potential power supply VDD or an arbitrary power supply in place of the low-potential power supply VSS.

As aforementioned, in the case of a configuration shown in FIG. 10, currents that flow through respective transistors of two differential pairs of the (M3, M4) and (M5, M6) are influenced to each other. Thus, if there is a comparatively large variation between the devices, a slew rate will vary.

On contrast therewith, in an embodiment shown in FIG. 1, by temporarily eliminating interactions between the currents that flow through the two differential pairs (M3, M4) and (M5, M6) by the switches SW11 and SW12, a variation in the slew rate is suppressed. A specific operation will be described below.

Figure 2:
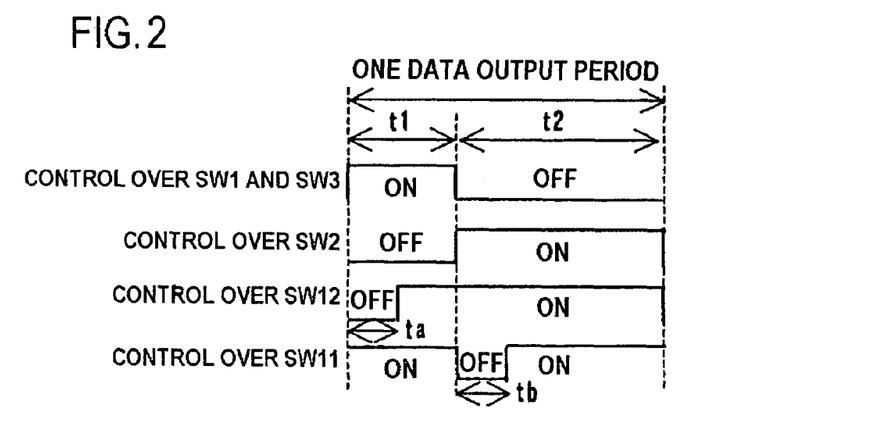
FIG. 2 is a diagram showing an example of switch control in the embodiment mode of the present invention.

FIG. 2 shows a timing chart showing a control signal S1 for controlling switching on and off of switches SW1 and SW3, a control signal S2 for controlling switching on and off of a switch SW2, a signal S3 for controlling switching on and off of the switch SW12, and a signal S4 for controlling switching on and off of the switch SW11, in FIG. 1. In this embodiment, the control signals S1 and S2 are the same as those in an example shown in FIG. 14. Operations of the switches SW11 and SW12 will be described below with reference to FIG. 2.

First, in a period ta immediately after the start of a period t1, the switch SW12 is turned off by the control signal S3. The switch SW11 is set to remain on throughout the period t1.

With this arrangement, the currents for the differential pair (M5, M6) are blocked and the operation of the differential pair (M5, M6) is stopped during the period ta. At this point, assuming that currents i3 and i4 that flow through the differential pair (M3, M4) are determined by a current mirror (M1, M2) and no device variation is present in the current mirror (M1, M2), the following relation holds in a stable operation state:

$$i3=i4=I8/2 \qquad (8)$$

With this relation, a change in the current i3 during the period ta extends in the following range:

$$I8 \geq i3 \geq I8/2 \qquad (9)$$

Incidentally, the above formulas (8) and (9) hold irrespective of device variations in the two differential pairs (M3, M4) and (M5, M6), and become unrelated to a current i5 for the transistor M5.

Accordingly, during the period ta, the amount of the increment of the current i3 becomes constant irrespective of the device variations in the differential pairs (M3, M4) and (M5, M6), so that the slew rate becomes constant.

In this embodiment mode, the period ta is set, based on the time required for an output voltage Vout to reach around a reference voltage Vref in the period t1.

Then, after completion of the period ta, the switch 12 is turned on, and during the remainder of the period t1, a voltage (Vref+Vf) adding an offset voltage Vf to the reference voltage Vref is stored in the capacitance element C1.

Next, in a period tb immediately after the start of the period t2, the switch SW11 is turned off by the control signal S4. The switch SW12 is set to remain on throughout the period t2.

With this arrangement, during the period tb, the currents for the differential pair (M3, M4) are blocked, so that the operation of the differential pair (M3, M4) is stopped.

The current i5 and a current i6 that flow through the differential pair (M5, M6) at this point are determined by the current mirror (M1, M2), and the following relation holds in the operation stable state.

$$i5=i6=I9/2 \qquad (10)$$

With this relation, a change in the current i5 during the period tb extends in the following range:

$$I9 \geq i5 \geq I9/2 \qquad (11)$$

Incidentally, the above formulas (10) and (11) hold irrespective of the device variations in the two differential pairs (M3, M4) and (M5, M6), and become unrelated to the current i3.

Accordingly, during the period tb, the amount of the increment of the current i5 becomes constant irrespective of the device variations in the differential pairs (M3, M4) and (M5, M6), so that the slew rate also becomes constant.

The period tb is set, based on the time required for the output voltage Vout to reach around an input voltage Vin in the period t2.

Then, after completion of the period tb, the switch SW11 is turned on, and during the remainder of the period t2, the offset of the output voltage Vout is cancelled, and the output voltage Vout is driven to the voltage equal to the input voltage Vin.

As described above, in this embodiment mode shown in FIG. 1, the switches SW11 and SW12 are inserted into the current paths of the current sources M8 and M9 for supplying tail currents to the differential pairs, respectively, and the switch SW12 is controlled during the period ta provided for the period t1, and the switch SW11 is controlled during the period tb provided for the period t2. The slew rate of the output voltage can be kept to be constant without depending on the device variations of the differential pairs (M3, M4) and (M5, M6).

Incidentally, when the Vref is set to be equal to the Vin, the output voltage Vout is driven to around the input voltage Vin in the period ta. Thus, the output voltage Vout will not change greatly during the period t2. Accordingly, the slew rate in the period t2 does not need to be considered, and in this case, control over the switch SW11 and the period tb does not need to be performed. That is, it is enough to switch off the switch SW12 during the period ta.

In the configuration shown in FIG. 1, a description was given to an example where the circuits for controlling the activation and the deactivation of the current sources M8 and M9 are constituted from the switch SW11 connected in series with the current source M8 and the switch SW12 connected in series with the current source M9. A configuration other than this can be of course employed.

The current sources M8 and M9 may be respectively formed of a transistor with a bias voltage is applied to the control terminal thereof, for example, and by changing the bias voltage, the activation and the deactivation of the current sources M8 and M9 may be controlled.

Figure 3:
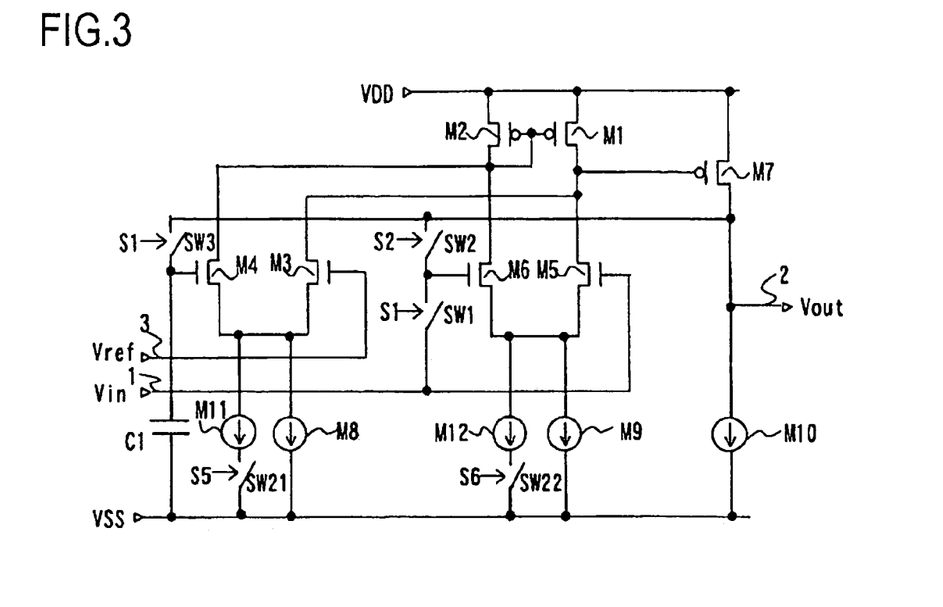
FIG. 3 is a diagram showing a configuration of other embodiment mode of the present invention.

FIG. 3 is a diagram showing a configuration of a second embodiment mode of the present invention, and shows the configuration to which circuits for modulating currents for driving the differential pairs (M3, M4) (M5, M6) are added to the offset canceling amplifier shown in FIG. 15. Referring to FIG. 3, a current source Mi1 and a switch SW21 connected in series are provided between the common source of the differential pair (M3, M4) and the low-potential power supply VSS, being in parallel with the current source M8. A current source M12 and a switch SW22 connected in series are provided between the common source of the differential pair (M5, M6) and the low-potential power supply VSS, being parallel with the current source M9.

In the embodiment mode shown in FIG. 3, by modulating the currents for driving the two differential pairs (M3, M4) and (M5, M6), the interaction of the currents that flow through the respective transistors of the differential pairs is suppressed, thereby suppressing a variation in the slew rate. A specific operation will be described below.

Figure 4:
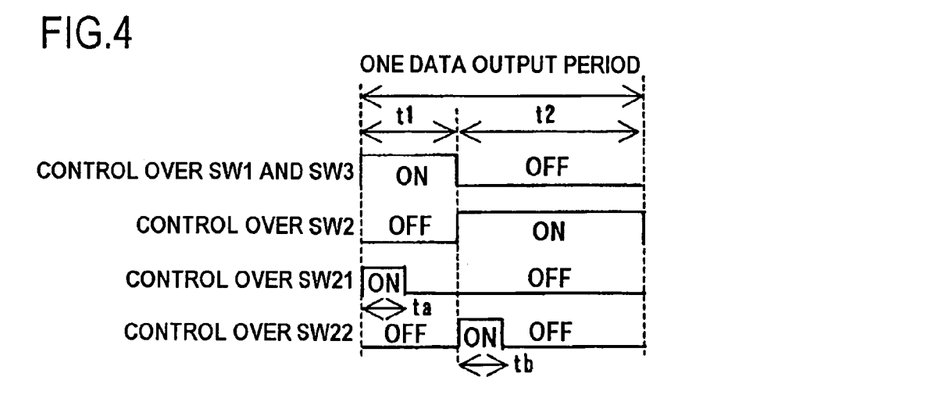
FIG. 4 is a diagram showing an example of switch control in other embodiment mode of the present invention.

FIG. 4 is a diagram showing a timing chart for switching on and off of each of the switches SW1, SW2, SW3, SW21, and SW22 in the embodiment of the present invention. The control signals S1 and S2 are the same as those in FIG. 14. Operations of the switches SW21 and SW22 will be described below with reference to FIG. 4.

First, in the period ta immediately after the start of the period t1, the switch SW21 is turned on by a control signal S5. The switch SW22 is set to remain off throughout the period t1.

With this arrangement, in the period ta, the currents for the differential pair (M3, M4) are increased. A change in the current i3 during the period ta extends in the following range by the above formula (6), based on the same principle in FIGS. 10 and 11. The current for the current source M11 is set to a constant current I11.

$$I8+I11 \geq i3 \geq \{(I8+I9+I11)/2\}-i5 \quad (12)$$

From the above formula (12), it can be seen that, by addition of the term of the current I11, the range of the change in the current i3 is less influenced by the current i5 that varies according to the device variation of the differential pair. Accordingly, a variation in the slew rate caused by the device variations of the differential pairs is also reduced.

The period ta is set, based on the time required for the output voltage Vout to reach around the reference voltage Vref in the period t1. Then, after completion of the period ta, the switch SW21 is turned off, and during the remainder of the period t1, the voltage (Vref+Vf) adding the offset voltage Vf to the reference voltage Vref is stored in the capacitance element C1.

Next, the switch SW22 is turned on by a control signal S6 in the period tb immediately after the start of the period t2. The switch SW21 is set to remain off throughout the period t2. With this arrangement, the currents for the differential pair (M5, M6) are increased in the period tb.

A change in the current i5 during the period tb extends in the following range by the above formula (7), based on the same principle in FIGS. 10 and 11. The current for the current source M12 is set to a constant current I12.

$$I9+I12 \geq i5 \geq \{(I8+I9+I12)/2\}-i3 \quad (13)$$

From the above formula (13), it can be seen that, by addition of the term of the current I12, the range of the change in the current i5 is less influenced by the current i3 that varies according to the device variation of the differential pair. Accordingly, a variation in the slew rate caused by the device variations of the differential pairs is also reduced.

The period tb is set, based on the time required for the output voltage Vout to reach around the reference voltage Vref in the period t2. Then, after completion of the period tb, the switch SW22 is turned off, and during the remainder of the period t2, the offset of the output voltage Vout is cancelled and the output voltage Vout is driven to be the voltage equal to the input voltage Vin.

As described above, referring to FIG. 3, the current sources M11 and M12 and the switches SW21 and SW22 are provided, the switch SW21 is controlled during the period ta provided for the period t1, and the switch SW22 is controlled during the period tb provided for the period t2. A variation in the slew rate with respect to the device variations of the differential pairs (M3, M4) (M5, M6) can be thereby suppressed and maintained to be substantially constant.

Incidentally, when the Vref is set to be equal to the Vin, the output voltage Vout is driven to around the input voltage Vin in the period ta. Thus, the output voltage Vout will not change greatly in the period t2. Accordingly, the slew rate in the period t2 does not need to be considered, and in this case, control over the current source M12, switch SW22 and period tb does not need to be performed.

FIG. 3 shows an example of the circuits for modulating the currents for driving the differential pairs (M3, M4) and (M5, M6). Other configuration may be of course employed. The current sources M8 and M9 may be respectively formed of a transistor with a bias voltage applied to the control terminal thereof, for example, and by changing the bias voltage, the current values of the current sources M8 and M9 may be modulated and controlled.

Figure 9:
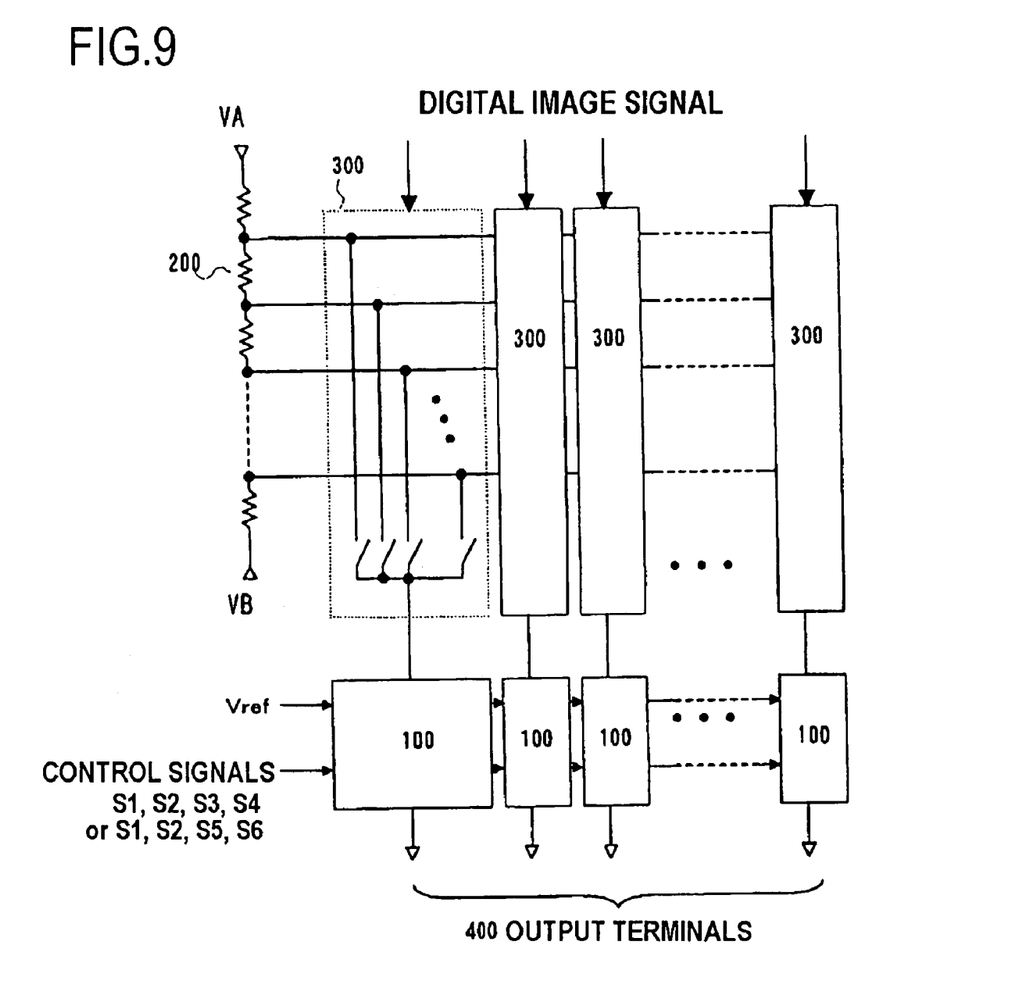
FIG. 9 is a diagram showing a configuration of a display device of the present invention.

An embodiment of a display device according to the present invention will be described. FIG. 9 is a diagram showing a configuration of the embodiment of the present invention. By applying the offset canceling amplifier in FIGS. 1 or 3 to an output buffer 100 of a data driver in the display device, a voltage output with high accuracy can be achieved and variations in the slew rate of outputs can be suppressed in the data drivers (a driving circuit having multiple outputs) of the display device constituted from thin film transistors. The display quality of the display device can be thereby maintained. A specific embodiment will be described below.

Embodiments

Figure 5:
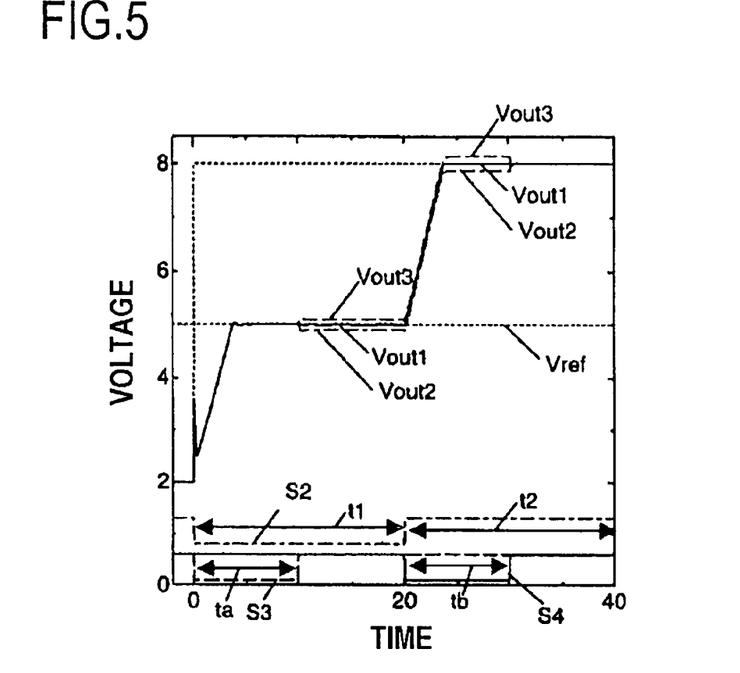
FIG. 5 is a graph showing results of simulations in an embodiment of the present invention.

FIG. 5 is a graph showing results of simulations in the configuration of the embodiment mode shown in FIG. 1. The circuit for the simulations was the circuit in FIG. 10, to which the switches SW11 and SW12 were added. FIG. 5 shows waveforms of output voltages with respect to the input voltage Vin when the reference voltage Vref is set to 5V.

Referring to FIG. 5, an output voltage waveform Vout1 is obtained when no characteristic variation in circuit devices is present. An output voltage waveform Vout2 is obtained when a threshold voltage Vth5 of the N-channel transistor M5 is larger than a threshold voltage Vth6 of the N-channel transistor M6, and an output voltage waveform Vout3 is obtained when the Vth5 is smaller than the Vth6.

The variation ranges of the threshold voltages Vth5 and Vth6 are the same as those in the case of FIG. 11. Referring to FIG. 5, it is shown that the slew rates of the Vout2 and the Vout3 during the periods ta and tb are the same as that of the Vout1, and that the slew rate variation with respect to the variation in the devices of the differential pair (M5, M6) can be suppressed.

Figure 6:
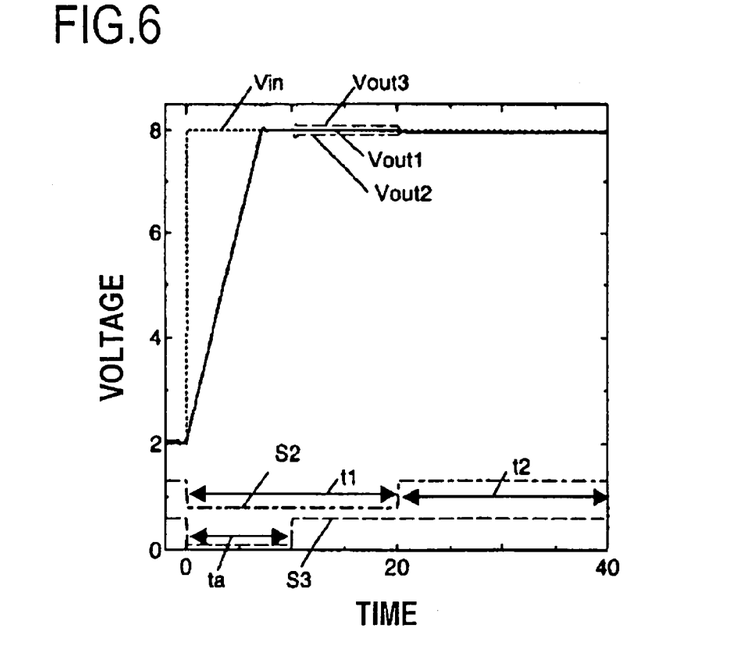
FIG. 6 is a graph showing results of simulations in the embodiment of the present invention.

FIG. 6 shows waveforms of output voltages with respect to the input Vin when the reference voltage Vref is set to be equal to the Vin. The circuit for simulations was the circuit in FIG. 10 to which only the switch SW12 was added.

FIG. 6 shows that the slew rates of the Vout2 and the Vout3 during the period ta are the same as that of the Vout1, and that the slew rate variation with respect to the variation in the devices of the differential pair (M5, M6) can be suppressed.

Figure 7:
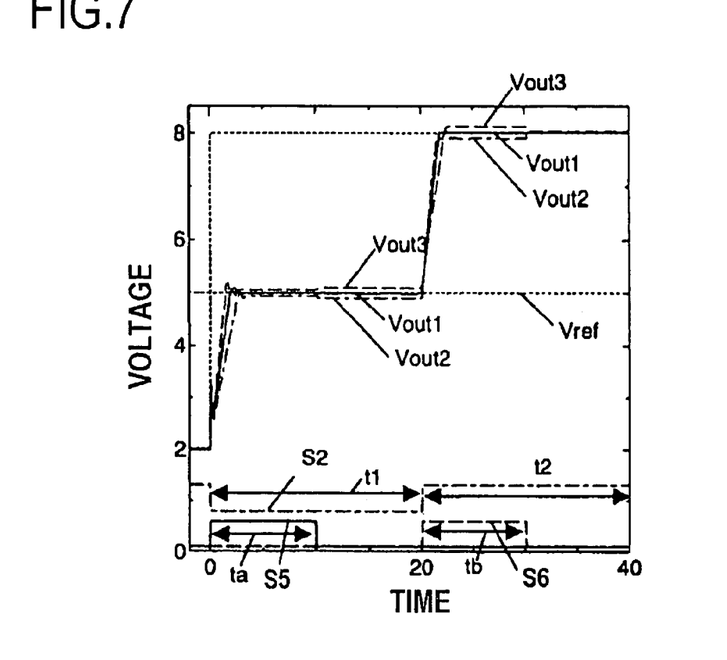
FIG. 7 is a graph showing results of simulations in a second embodiment of the present invention.

FIG. 7 shows results of simulations of the circuit of the embodiment mode shown in FIG. 3. The simulated circuit was the circuit having the configuration in FIG. 10, to which the current sources M11 and M12 (constituted from N-channel TFTs), and the switches SW21 and SW22 as shown in FIG. 3 were added.

FIG. 7 shows waveforms of output voltages with respect to the input voltage Vin when the reference voltage Vref is set to 5V. FIG. 7 shows that the slew rates of the Vout2 and the Vout3 during the periods ta and tb are sufficiently close to that of the Vout1, and that the slew rate variation with respect to the device variation of the differential pair (M5, M6) can be suppressed.

Figure 8:
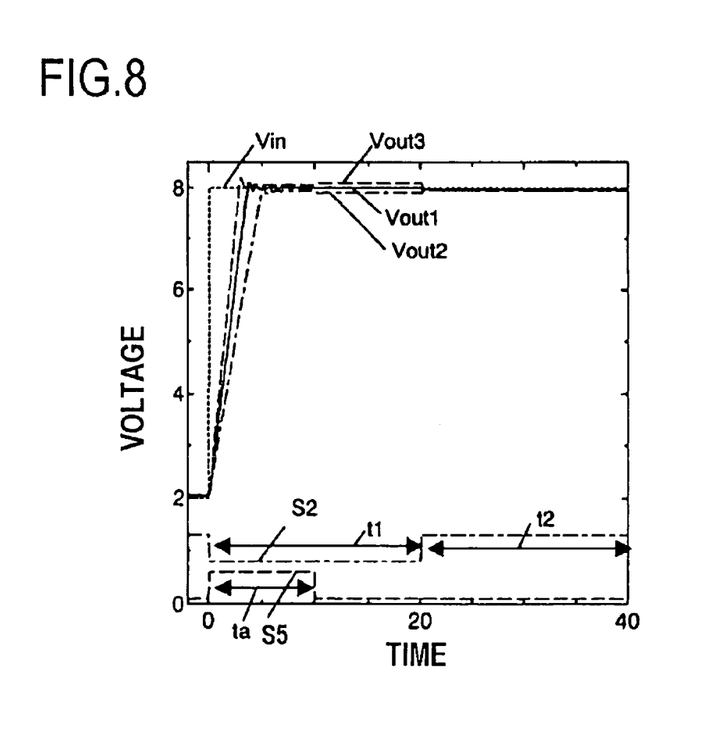
FIG. 8 is a graph showing results of simulations in the second embodiment of the present invention.

FIG. 8 shows waveforms of output voltages with respect to the input voltage Vin when the reference voltage Vref is set to be equal to the Vin. Incidentally, the simulated circuit was the circuit obtained by adding only the current source M11 and the switch SW21 to the circuit in FIG. 10. FIG. 8 shows that the slew rates of the Vout2 and the Vout3 during the period ta are sufficiently close to that of the Vout1, and that the slew rate variation with respect to the device variation of the differential pair (M5, M6) can be suppressed. FIGS. 5 through 8 show an example in which the differential pair (M5, M6) has the device variation. When the differential pair (M3, M4) also has the device variation, a slew rate variation can be prevented likewise.

Figure 16:
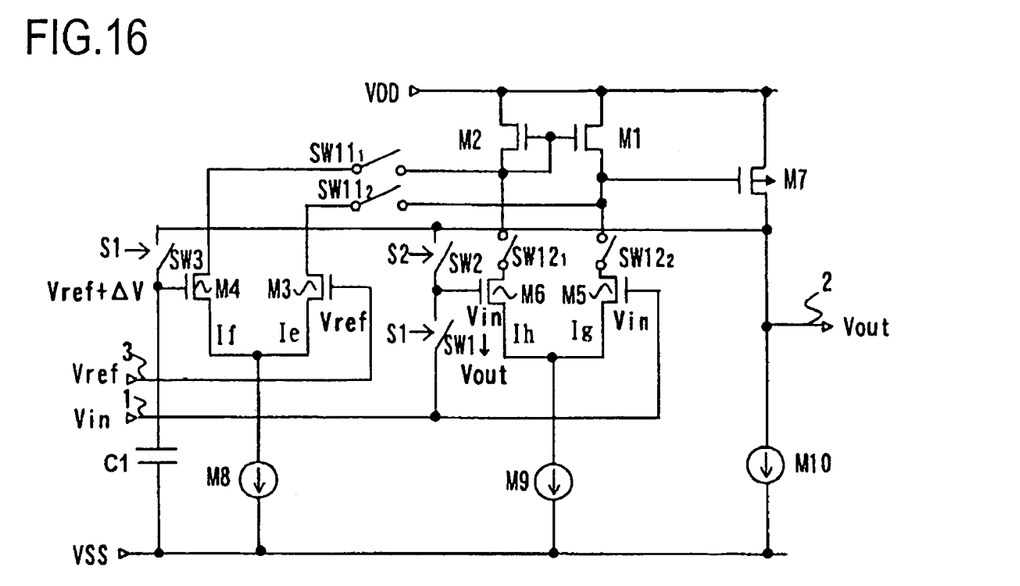
FIG. 16 is a diagram showing a configuration of still other embodiment of the present invention.

Incidentally, the configuration shown in FIG. 1 is the configuration provided with the circuits for controlling activation or deactivation of the two current sources M8 and M9 for supplying constant currents to the respective differential pairs (M5, M6) (M3, M4). Control over the activation or deactivation of the current sources M8 and M9 is substantially equivalent to control over the activation/deactivation of the differential pairs (M5, M6) and (M3, M4). Accordingly, the present invention may be configured to perform control over the activation/deactivation of the differential pairs (M3, M4) and (M5, M6). Specifically, in a configuration shown in FIG. 16, switches (SW11$_1$, SW11$_2$) may be inserted between the output pair of the differential pair (M3, M4) and the current mirror (M1, M2), and switches (SW12$_1$, SW12$_2$) may be inserted between the output pair of the differential pair (M5, M6) and the current mirror (M1, M2), and control over activation (connection to the current mirror (M1, M2)) and deactivation (disconnection from the current mirror (M1, M2)) of the differential pairs (M3, M4) and (M5, M6) may be performed by controlling the switches. At this point, the control terminal of the amplifying transistor M7 is connected to the output terminal of the current mirror (M1, M2). Based on an input control signal, the switches (SW11$_1$, SW11$_2$) simultaneously operate together to be switched on and off, and the switches (SW12$_1$, SW12$_2$) simultaneously operate together to be turned on and off, based on the input control signal. Control over connection/disconnection by the switches (SW12$_1$, SW12$_2$) between the output pair of the differential pair (M5, M6) and the current mirror (M1, M2) is performed using the control signal S3 shown in FIG. 2, for example. When the control signal S3 is high, the switches (SW12$_1$, SW12$_2$) are both turned on. When the control signal S3 is low, the switches (SW12$_1$, SW12$_2$) are both turned off. Control over connection/disconnection by the switches (SW11$_1$, SW11$_2$) between the output pair of the differential pair (M3, M4) and the current mirror (M1, M2) is performed using the control signal S4 shown in FIG. 2, for example. When the control signal S4 is high, the switches (SW11$_1$, SW11$_2$) are both turned on. When the control signal S4 is low, the switches (SW11$_1$, SW11$_2$) are turned off. Timing waveforms of the control signals S1, S2, S3, and S4 during one data output period are as shown in FIG. 2.

The foregoing description was given in connection with the embodiments described above. The present invention, however, is not limited to the configurations of the embodiments described above, and naturally includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier circuit comprising:
   first and second differential pairs;
   one load circuit connected in common to said first and second differential pairs;
   first and second current sources for supplying current to said first and second differential pairs, respectively;
   said differential amplifier circuit performing an amplifying operation responsive to a common output signal of said first and second differential pairs, wherein said differential amplifier circuit further comprises circuits for modulating and controlling a current value of at least one of said first and second current sources, each of said first and second current sources includes two distinct current sources in parallel, one of the two distinct current sources is in series with a switch, operation of said switch modulates the current value, said first and second current sources are provides between a common source of each differential pair and a power supply.

2. A differential amplifier circuit comprising:
   a load circuit connected to a first power supply;
   first and second differential pairs connected in common to said load circuit;
   first and second current sources for supplying currents to said first and second differential pairs, respectively;
   an amplifying element for driving an output terminal upon receipt of an output connected in common to said first and second differential pairs;
   a first switch connected between one input of said first differential pair and an input terminal;
   a second switch connected between the one input of said first differential pair and said output terminal;
   a third switch connected between one input of said second differential pair and said output terminal;
   a capacitance element connected to the one input of said second differential pair; and
   a fourth switch connected between said first differential pair and a second power supply, said fourth switch being connected in series with said first current source;
   the other input of said first differential pair and the other input of said second differential pair being both connected to said input terminal.

3. The differential amplifier circuit according to claim 2, wherein a fifth switch is connected between said second differential pair and a second power supply, said fifth switch being connected in series with said second current source.

4. The differential amplifier circuit according to claim 2, wherein a data output period comprises a first period and a second period;
   during the first period, said first and third switches are turned on, and said second switch is turned off;

during the second period, said first and third switches are turned off, and said second switch is turned on; and said fourth switch is turned on after being turned off for a predetermined period after a start of the first period.

5. A differential amplifier circuit comprising:

a load circuit connected to a first power supply;

first and second differential pairs connected in common to said load circuit;

first and second current sources for supplying currents to said first and second differential pairs, respectively;

an amplifying element for driving an output terminal upon receipt of an output connected in common to said first and second differential pairs;

a first switch connected between one input of said first differential pair and an input terminal;

a second switch connected between the one input of said first differential pair and an output terminal;

a third switch connected between one input of said second differential pair and said output terminal;

a capacitance element connected to the one input of said second differential pair;

a fourth switch connected between said first differential pair and a second power supply, said fourth switch being connected in series with said first current source; and a fifth switch connected between said second differential pair and said second power supply, said fifth switch being connected in series with said second current source;

the other input of said first differential pair being connected to said input terminal; and the other input of said second differential pair being connected to a reference voltage input terminal.

6. The differential amplifier circuit according to claim 5, wherein a data output period comprises a first period and a second period;

during the first period, said first and third switches are turned on, and said second switch is turned off;

during the second period, said first and third switches are turned off, and said second switch is turned on;

said fourth switch is turned on after being turned off for a predetermined period after a start of the first period; and said fifth switch is turned off for a predetermined period after a start of the second period and turned on during periods other than the predetermined period after the start of the second period, in the data output period.

7. A differential amplifier circuit comprising:

a load circuit connected to a first power supply;

first and second differential pairs connected in common to said load circuit;

first and second current sources for supplying currents to said first and second differential pairs, respectively;

an amplifying element for driving an output terminal upon receipt of an output connected in common to said first and second differential pairs;

a first switch connected between one input of said first differential pair and an input terminal;

a second switch connected between the one input of said first differential pair and said output terminal;

a third switch connected between one input of said second differential pair and said output terminal; and a capacitance element connected to the one input of said second differential pair;

the other input of said first differential pair and the other input of said second differential pair being both connected to said input terminal;

a series circuit comprising a third current source and a fourth switch being connected between said second differential pair and a second power supply, said series circuit being connected in parallel with said second current source.

8. The differential amplifier circuit according to claim 7, wherein a data output period comprises a first period and a second period;

during the first period, said first and third switches are turned on, and said second switch is turned off;

during the second period, said first and third switches are turned off, and said second switch is turned on; and said fourth switch is turned off after being turned on for a predetermined period after the start of the first period.

9. A differential amplifier circuit comprising:

a load circuit connected to a first power supply;

first and second differential pairs connected in common to said load circuit;

first and second current sources for supplying currents to said first and second differential pairs, respectively;

an amplifying element for driving an output terminal upon receipt of an output connected in common to said first and second differential pairs;

a first switch connected between one input of said first differential pair and an input terminal;

a second switch connected between the one input of said first differential pair and an output terminal;

a third switch connected between one input of said second differential pair and said output terminal; and a capacitance element connected to the one input of said second differential pair;

the other input of said first differential pair being connected to said input terminal;

the other input of said second differential pair being connected to a reference voltage input terminal;

a series circuit comprising a third current source and a fourth switch being connected between said first differential pair and a second power supply, said series circuit being connected in parallel with said first current source;

a series circuit comprising a fourth current source and a fifth switch being connected between said second differential pair and said second power supply, said series circuit being connected in parallel with said second current source.

10. The differential amplifier circuit according to claim 9, wherein a data output period comprises a first period and a second period;

during the first period, said first and third switches are turned on, and said second switch is turned off;

during the second period, said first and third switches are turned off, and said second switch is turned on;

said fifth switch is turned off after being turned on for a predetermined period after a start of the first period; and said fourth switch is turned on for a predetermined period after a start of the second period and turned off during periods other than the predetermined period after the start of the second period, in the data output period.

11. A display device comprising an amplifier circuit for inputting a gray-scale voltage and driving a data line connected to display elements, wherein said display device comprises a differential amplifier circuit according to claim 1 as said amplifier circuit.

12. A display device comprising an amplifier circuit for inputting a gray-scale voltage and driving a data line connected to display elements, wherein said display device comprises a differential amplifier circuit according to claim 2 as said amplifier circuit.

13. A display device comprising an amplifier circuit for inputting a gray-scale voltage and driving a data line connected to display elements, wherein said display device comprises a differential amplifier circuit according to claim 5 as said amplifier circuit.

14. A display device comprising an amplifier circuit for inputting a gray-scale voltage and driving a data line connected to display elements, wherein said display device comprises a differential amplifier circuit according to claim 7 as said amplifier circuit.

15. A display device comprising an amplifier circuit for inputting a gray-scale voltage and driving a data line connected to display elements, wherein said display device comprises a differential amplifier circuit according to claim 9 as said amplifier circuit.

16. A differential amplifier circuit comprising:
a load circuit connected to a first power supply;
first and second differential pairs connected in common to said load circuit;
first and second current sources for supplying currents to said first and second differential pairs, respectively;
an amplifying element for driving an output terminal upon receipt of an output connected in common to said first and second differential pairs;
a first switch connected between one input of said first differential pair and an input terminal;
a second switch connected between the one input of said first differential pair and said output terminal;
a third switch connected between one input of said second differential pair and said output terminal; and
a capacitance element connected to the one input of said second differential pair, the other input of said first differential pair and the other input of said second differential pair being both connected to said input terminal, wherein
said differential amplifier circuit further comprises circuits for controlling activation/deactivation of at least one of said first and second current sources.

17. A differential amplifier circuit comprising:
a load circuit connected to a first power supply;
first and second differential pairs connected in common to said load circuit;
first and second current sources for supplying currents to said first and second differential pairs, respectively;
an amplifying element for driving an output terminal upon receipt of an output connected in common to said first and second differential pairs;
a first switch connected between one input of said first differential pair and an input terminal;
a second switch connected between the one input of said first differential pair and said output terminal;
a third switch connected between one input of said second differential pair and said output terminal; and
a capacitance element connected to the one input of said second differential pair, the other input of said first differential pair and the other input of said second differential pair being both connected to said input terminal, wherein
said differential amplifier circuit further comprises circuits for modulating and controlling a current value of at least one of said first and second current sources.

18. A differential amplifier circuit comprising:
a load circuit connected to a first power supply;
first and second differential pairs connected in common to said load circuit;
first and second current sources for supplying currents to said first and second differential pairs, respectively;
an amplifying element for driving an output terminal upon receipt of an output connected in common to said first and second differential pairs;
a first switch connected between one input of said first differential pair and an input terminal;
a second switch connected between the one input of said first differential pair and said output terminal;
a third switch connected between one input of said second differential pair and said output terminal;
a capacitance element connected to the one input of said second differential pair, the other input of said first differential pair and the other input of said second differential pair being both connected to said input terminal, wherein
said differential amplifier circuit further comprises circuits for controlling activation/deactivation of at least one of said first and second differential pairs.

* * * * *